United States Patent
Park et al.

(10) Patent No.: US 9,671,440 B2
(45) Date of Patent: Jun. 6, 2017

(54) METHOD AND DEVICE FOR DETECTING ZERO PHASE COMPONENT

(75) Inventors: Yong Up Park, Daejeon (KR); Won Suck Choi, Seoul (KR); Byung Sung Lee, Daejeon (KR); Sun Kyu Choi, Daejeon (KR); Kil Sin Kim, Daejeon (KR); Seok Gon Kim, Daejeon (KR); Sang-Jun Kim, Daejeon (KR)

(73) Assignee: Korea Electric Power Corporation, Seoul (KR)

( * ) Notice: Subject to any disclaimer, the term of this patent is extended or adjusted under 35 U.S.C. 154(b) by 159 days.

(21) Appl. No.: 14/342,153

(22) PCT Filed: Sep. 30, 2011

(86) PCT No.: PCT/KR2011/007246
§ 371 (c)(1),
(2), (4) Date: Feb. 28, 2014

(87) PCT Pub. No.: WO2013/039275
PCT Pub. Date: Mar. 21, 2013

(65) Prior Publication Data
US 2014/0232373 A1   Aug. 21, 2014

(30) Foreign Application Priority Data
Sep. 15, 2011 (KR) .................. 10-2011-0092918

(51) Int. Cl.
G01R 25/00 (2006.01)
G01R 29/16 (2006.01)

(52) U.S. Cl.
CPC ............. *G01R 25/00* (2013.01); *G01R 29/16* (2013.01)

(58) Field of Classification Search
CPC ........... G01R 25/00; G01R 29/16; H02H 3/26
(Continued)

(56) References Cited

U.S. PATENT DOCUMENTS

| 5,059,896 A * | 10/1991 | Germer | G01R 15/09 324/115 |
| 6,727,682 B1 * | 4/2004 | Tobin | G01R 15/148 324/117 H |

(Continued)

FOREIGN PATENT DOCUMENTS

| JP | 2006-138691 A | 6/2006 |
| KR | 10-1994-0008305 | 4/1994 |

(Continued)

OTHER PUBLICATIONS

International Search Report, w/ English translation thereof, issued in International Application No. PCT/KR2011/007246 dated Sep. 12, 2012.

(Continued)

*Primary Examiner* — Jermele M Hollington
*Assistant Examiner* — Zannatul Ferdous
(74) *Attorney, Agent, or Firm* — McDermott Will & Emery LLP

(57) ABSTRACT

There are provided a method and device for detecting a zero phase component. The device for detecting a zero phase component includes a meter chip of a sequential sampling method, a data acquiring unit configured to acquire sequential data on a plurality of phases from the meter chip, and a zero phase current value calculating unit configured to calculate an instantaneous current value for fault detection by summing instantaneous current values for each phase from the acquired sequential data, and calculate a zero phase current value using the calculated instantaneous current value for fault detection.

8 Claims, 17 Drawing Sheets

(58) Field of Classification Search
USPC .................................................... 324/76.77
See application file for complete search history.

(56) References Cited

U.S. PATENT DOCUMENTS

| | | | |
|---|---|---|---|
| 2004/0057178 A1* | 3/2004 | Kase | ...................... H02H 3/081 |
| | | | 361/85 |
| 2013/0057408 A1* | 3/2013 | Aiken | .................. H02H 1/0023 |
| | | | 340/635 |

FOREIGN PATENT DOCUMENTS

| | | |
|---|---|---|
| KR | 10-1995-7002309 | 6/1995 |
| KR | 10-1997-0048588 | 7/1997 |
| KR | 10-2009-0056686 A | 6/2009 |

OTHER PUBLICATIONS

Korean Office Action, w/ English translation thereof, issued in Korean Patent Application No. KR 10-2011-0092918 dated Oct. 29, 2012.

\* cited by examiner

US 9,671,440 B2

METHOD AND DEVICE FOR DETECTING ZERO PHASE COMPONENT

RELATED APPLICATIONS

This application is the U.S. National Phase under 35 U.S.C. §371 of International Application No. PCT/KR2011/007246, filed on Sep. 30, 2011, which in turn claims the benefit of Korean Application No. 10-2011-0092918, filed on Sep. 15, 2011, the disclosures of which Applications are incorporated by reference herein.

TECHNICAL FIELD

The present invention relates to a method and device for detecting a zero phase component, and more specifically, to a method and device for detecting a zero phase component of an electronic watt-hour meter using a meter chip of a sequential sampling method.

BACKGROUND ART

As a sample data acquiring method of most watt-hour meters currently used in Korea, a sequential sampling method is applied. Therefore, it is difficult to apply a fault related monitoring function to which a general method of detecting a zero phase component (a simultaneous sampling method) is applied to the watt-hour meter of the sequential sampling method.

In general, zero phase component detection of the watt-hour meter is applied in order to monitor a fault of an MOF. As a recently proposed MOF fault detection system, there is a method in which a CT is directly attached to a P0 cable of the watt-hour meter and the zero phase component is detected remotely.

This is an ideal system capable of acquiring a zero phase component. However, in consideration of an installation place of the MOF or a cost of an accessory having a degree of precision above a predetermined level, an application place is limited.

In addition, it requires that a separate communication system for remote management be installed. Therefore, a change of existing hardware, additional attachment, and the like, are unavoidable and thereby there is a burden of increased costs.

DISCLOSURE

Technical Problem

In view of the aforementioned problems in the related art, the present invention provides a method that detects a zero phase component in a watt-hour meter of a sequential sampling method, decreases a computation burden, increases reliability of a result value, and has no influence on a degree of precision of a device, and a device therefor.

Objects of the present invention are not limited to the aforementioned objects and other unmentioned objects may be clearly understood from the following description.

Technical Solution

In order to achieve the above object, according to an aspect of the present invention, there is provided a device for detecting a zero phase component. The device includes a meter chip of a sequential sampling method, a data acquiring unit configured to acquire sequential data on a plurality of phases from the meter chip, and a zero phase current value calculating unit configured to calculate an instantaneous current value for fault detection by summing instantaneous current values for each phase from the acquired sequential data, and calculate a zero phase current value using the calculated instantaneous current value for fault detection.

The device for detecting a zero phase component may further include a monitoring unit in which it is determined whether the calculated zero phase current value exceeds a predetermined reference value, and when it exceeds the reference value, event information corresponding thereto is generated.

The device for detecting a zero phase component may further include a communicating unit configured to transmit the generated event information to a terminal of an administrator.

The zero phase current value calculating unit may extract a number of the instantaneous current values for fault detection corresponding to the plurality of phases.

The zero phase current value calculating unit may calculate first, second, and third instantaneous current values for fault detection when the plurality of phases are three phases, and calculate the first instantaneous current value for fault detection as "first-phase first instantaneous current value+second-phase second instantaneous current value+third-phase third instantaneous current value," the second instantaneous current value for fault detection as "second-phase first instantaneous current value+third-phase second instantaneous current value+first-phase third instantaneous current value," and the third instantaneous current value for fault detection as "third-phase first instantaneous current value+first-phase second instantaneous current value+second-phase third instantaneous current value."

The zero phase current value calculating unit may calculate the zero phase current value by summing sum the first, second, and third instantaneous current values for fault detection.

In order to achieve the above object, according to another aspect of the present invention, there is provided a method of detecting a zero phase component in a sequential sampling method. The method includes (a) acquiring sequential data on a plurality of phases from a meter chip of a sequential sampling method; (b) calculating an instantaneous current value for fault detection by summing instantaneous current values for each phase from the acquired sequential data; (c) calculating a zero phase current value based on the calculated instantaneous current value for fault detection; and (d) determining whether the calculated zero phase current value exceeds a predetermined reference value, and when it exceeds the reference value, generating event information corresponding thereto.

The method of detecting a zero phase component may further include transmitting the event information generated in the operation of (d) to a terminal of an administrator.

In the operation of (b), a number of the instantaneous current values for fault detection corresponding to the plurality of phases may be extracted.

In the operation of (c), the zero phase current value may be calculated by summing the instantaneous current values for fault detection of the extracted number may be summed and the zero phase current value.

Specific details for achieving the above object will be clear when the accompanying drawings and embodiments to be described in detail are referred to.

However, the present invention is not limited to the embodiments to be disclosed below and may be composed in various different forms. The present embodiments are provided to complete disclosure of the present invention and to let know the scope and spirit of the present invention completely for those skilled in the art.

Advantageous Effects

In a method and device for detecting a zero phase component according to an aspect of the present invention, it is possible to detect a zero phase component in a watt-hour meter of a sequential sampling method.

In addition, a computation burden decreases, reliability of a result value increases, and there may be no influence on a degree of precision of a device.

Furthermore, since it is possible to upgrade firmware even in an existing installed watt-hour meter, field application is easy and it is possible to rapidly reflect a specification of the watt-hour meter.

Moreover, through regular remote monitoring of a person in charge, it is possible to perform systematic and efficient MOF fault management.

Further, since most watt-hour meters used outside Korea also currently use the sequential sampling method, it is possible to contribute beneficial improvements through MOF management.

MODES OF THE INVENTION

Figure 1:
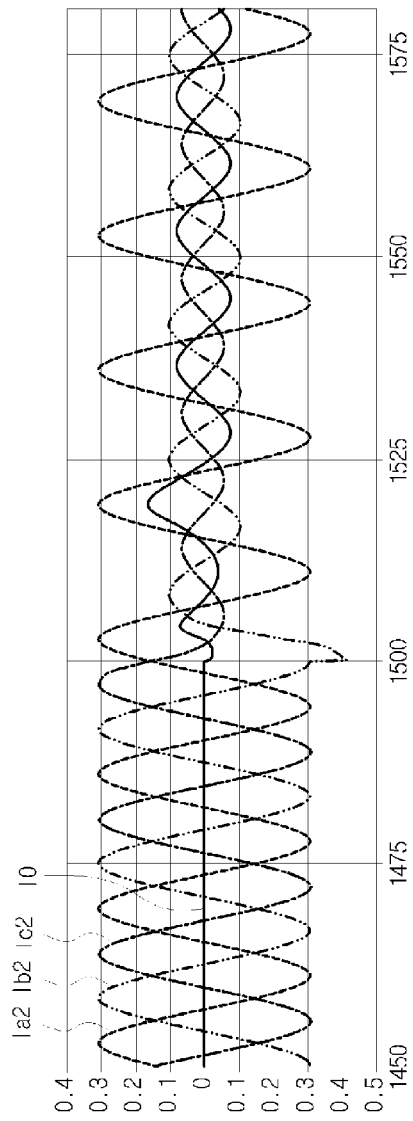
FIG. 1 is a diagram illustrating secondary current of a general three-phase unbalanced Δ transformer.

While the invention can be modified in various ways and take various embodiments, specific embodiments thereof are shown in the drawings and described in detail below as examples.

There is no intent to limit the invention to the particular embodiments disclosed. On the contrary, it should be understood that the invention is to cover all modifications, equivalents, and alternatives falling within the spirit and scope of the invention.

In description of the invention, when it is determined that detailed descriptions of related well-known technology may unnecessarily obscure the gist of the invention, detailed descriptions thereof will be omitted.

In addition, parts irrelevant to description are omitted in the drawings in order to clearly explain the present invention. Similar parts are denoted by similar reference numerals throughout this specification.

Referentially, throughout this specification, when a part is referred to as being "connected" to another part, it includes "directly connected" and "electrically connected" via an intervening part.

Also, when a certain part "includes" a certain component, this does not exclude other components from being included unless described otherwise, and other components may in fact be included.

Hereinafter, detailed content of embodiments of the present invention will be described with reference to the accompanying drawings.

For the embodiment of the present invention, simulation for observing a transformer load current balance characteristic and MOF inrush current was performed.

For reference, the simulation used for the embodiment of the present invention uses a PSCAD/EMTDC that is program for analyzing transient phenomena of power systems.

As a simulation condition for observing a three-phase current imbalance characteristic of the Δ transformer, it is assumed that three-phase loads are first balanced and maintained but a load condition of each phase is changed to an imbalance condition at 1.5 seconds.

In addition, the simulation condition was synchronized by assuming that a sampling rate of an electronic watt-hour meter is set to 42.

When three-phase load current is unbalanced, in a Y neutral grounding method, zero phase current corresponding to unbalanced current flows into a neutral conductor, but in a Δ winding method, when load current of a secondary side is unbalanced, a size of each phase current value of a primary side of the transformer is changed and the load current is maintained in a balance condition.

Accordingly, three-phase balanced current also flows into the electronic watt-hour meter. At this time, a power value of the watt-hour meter is measured as the same as an amount of load power.

FIG. 1 is a diagram illustrating secondary current of a general three-phase unbalanced Δ transformer.

Figure 2:
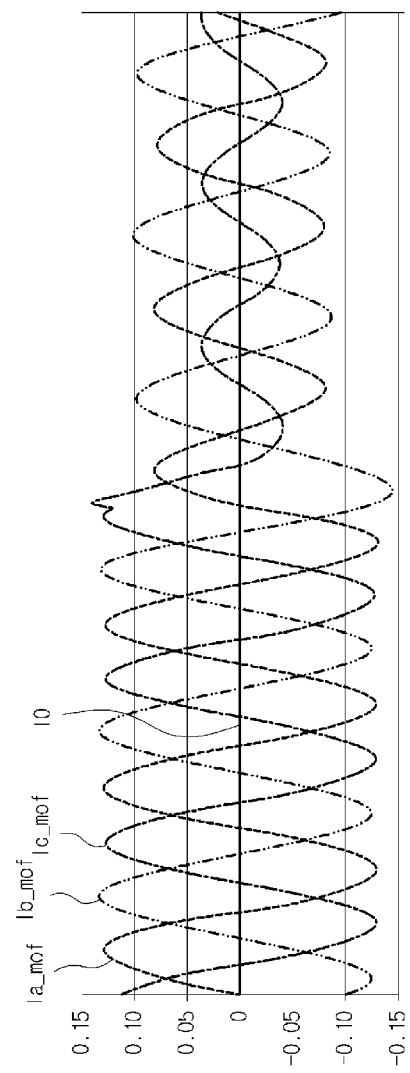
FIG. 2 is a diagram illustrating primary current of the general three-phase unbalanced Δ transformer.

When the load condition of each phase is changed to the imbalance condition at 1.5 seconds after the simulation starts, current of the watt-hour meter of the secondary side of the transformer is represented as illustrated in FIG. 2. At this time, it is observed that zero phase current (Po: thick blue line) changes.

FIG. 2 is a diagram illustrating primary current of the general three-phase unbalanced Δ transformer.

Figure 3:
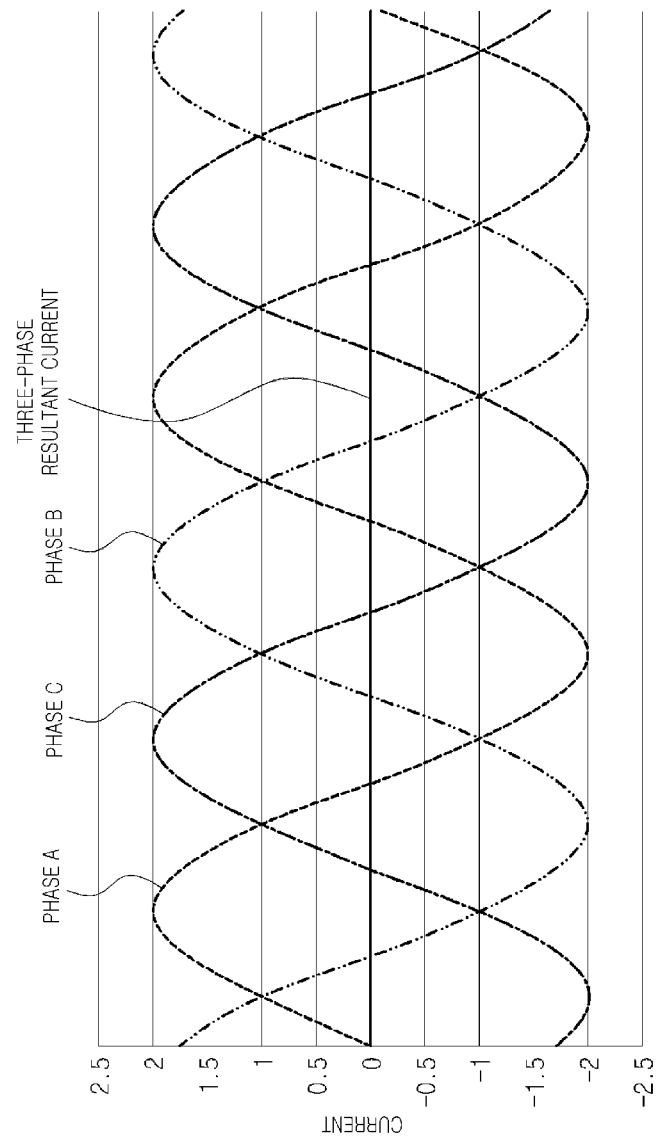
FIG. 3 is a diagram illustrating result values of zero phase current and current of a general watt-hour meter when three-phase current is in a balance condition.

When the load condition of each phase is changed to the imbalance condition at 1.5 seconds after the simulation starts, current of the watt-hour meter of the primary side of the transformer is shown in a pattern different from current of the secondary side thereof as illustrated in FIG. 3. It is observed that the zero phase current at this time is maintained at 0.

Hereinafter, a current characteristic of a zero phase component of the watt-hour meter due to an MOF fault will be described with reference to FIGS. 3 to 5.

A ratio error and a phase difference of current are defined as conditions for detecting the zero phase current in the watt-hour meter due to the MOF fault. In order to verify this, simulation was performed in a normal state and in each fault condition for detecting the zero phase current.

FIG. 3 is a diagram illustrating result values of zero phase current and current of a general watt-hour meter when three-phase current is in a balance condition.

As illustrated in FIG. 3, when the three-phase current is in the balance condition, it is observed that the zero phase current is maintained at 0.

Figure 4:
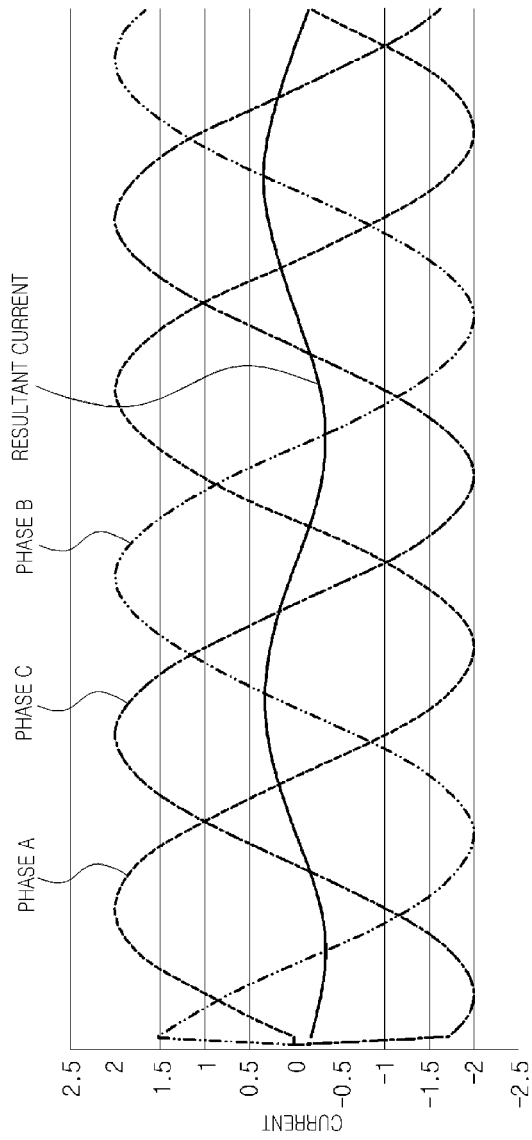
FIG. 4 is a diagram illustrating result values of zero phase current and current of a general watt-hour meter when three-phase current is in an imbalance (phase difference) condition.

FIG. 4 is a diagram illustrating result values of zero phase current and current of a general watt-hour meter when three-phase current is in an imbalance (phase difference) condition.

When a phase angle of a phase B due to the MOF fault is unbalanced, result values of zero phase current and current of the watt-hour meter are shown.

Figure 5:
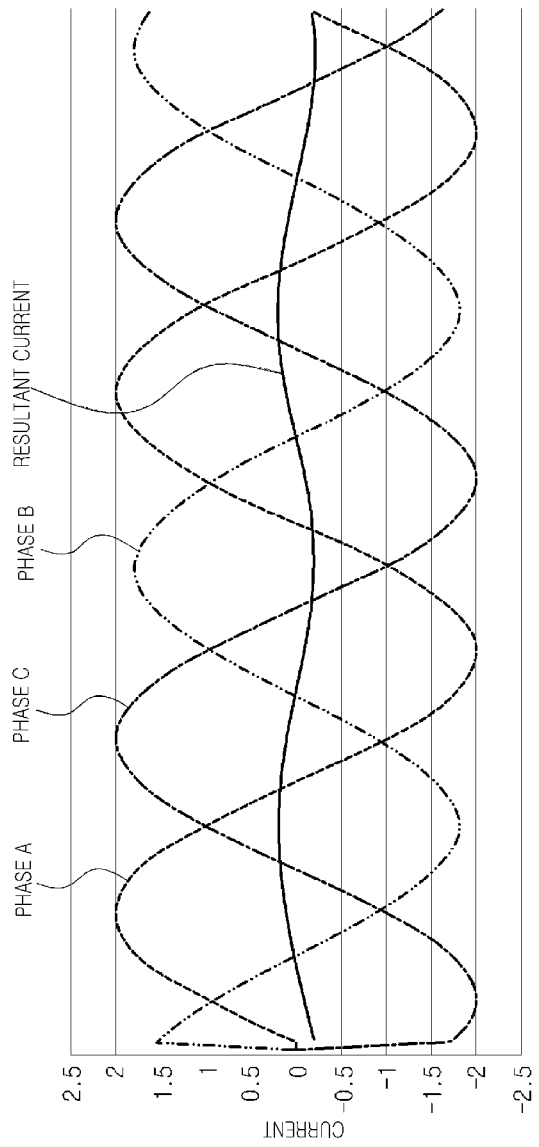
FIG. 5 is a diagram illustrating result values of zero phase current and current of a general watt-hour meter when three-phase current is in an imbalance (ratio error) condition.

FIG. 5 is a diagram illustrating result values of zero phase current and current of a general watt-hour meter when three-phase current is in an imbalance (ratio error) condition.

When an amount of current of a phase B due to the MOF fault is unbalanced, result values of zero phase current and current of the watt-hour meter are shown.

As illustrated in FIGS. 4 and 5, it is observed that, in the Δ winding method, even when the load condition is unbalanced, no zero phase component is detected in the watt-hour meter, and the zero phase component is detected only in the imbalance condition due to the MOF fault.

Meanwhile, in the aforementioned simulation, the zero phase component was detected by applying the simultaneous sampling method of the load current.

However, due to cost burdens of a meter chip of the simultaneous sampling method, most watt-hour meters apply the sequential sampling method.

Here, the sequential sampling method is a method of correcting an error due to a time difference of sampled measurement values. This is a prerequisite for the watt-hour meter in order to calculate a maximum power value, a power factor, and the like.

Figure 6:
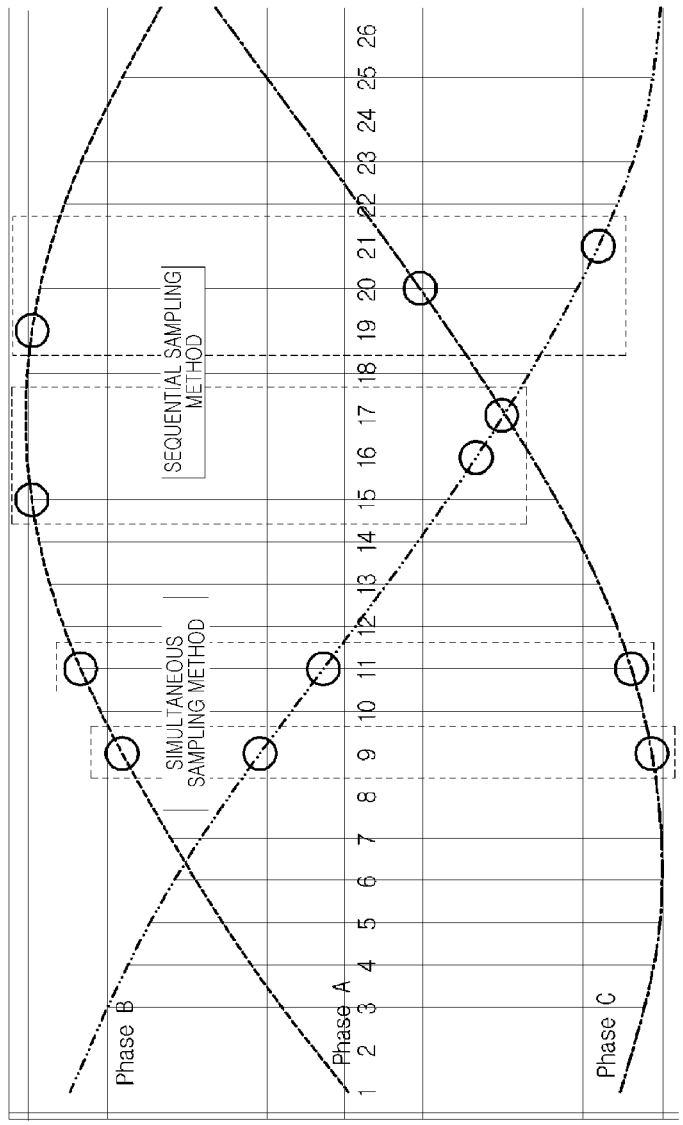
FIG. 6 is a diagram illustrating a simultaneous sampling method and a sequential sampling method.

FIG. 6 is a diagram illustrating a simultaneous sampling method and a sequential sampling method.

In the simultaneous sampling method, sampled three-phase instantaneous current values are summed. In consideration of the watt-hour meter, error tolerance of the MOF, and the like, when this is detected at a predetermined value or more, it may be considered as the zero phase component.

Figure 7:
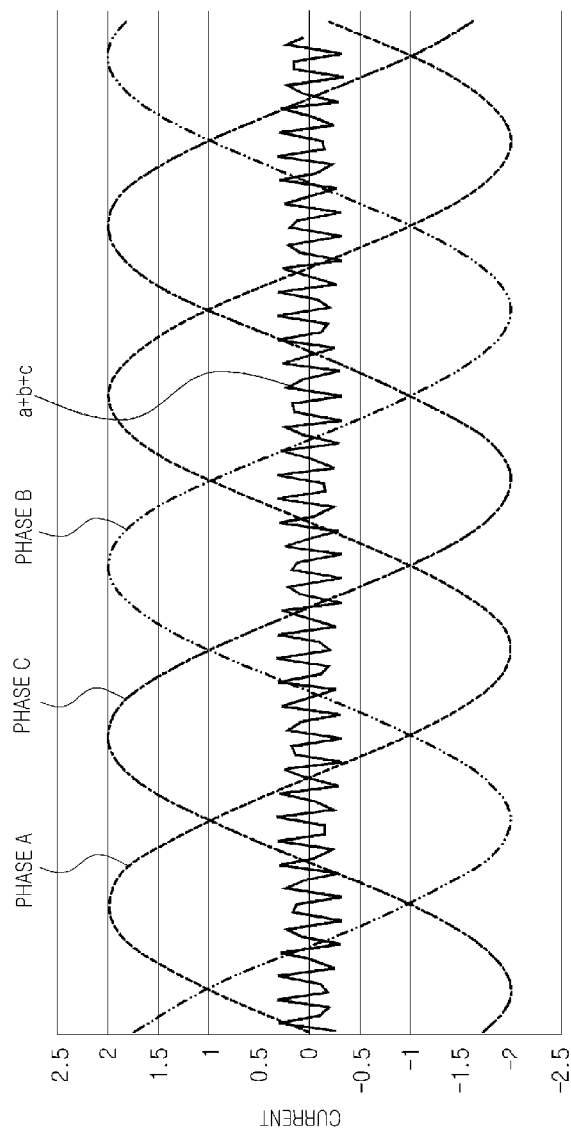
FIG. 7 is a diagram illustrating outcomes when a method of detecting a zero phase component of a simultaneous sampling method is applied to a sequential sampling method.

FIG. 7 is a diagram illustrating outcomes when a method of detecting a zero phase component of the simultaneous sampling method is applied to the sequential sampling method.

In the sequential sampling method, when the zero phase component is detected using the simultaneous sampling method (that is, as described with reference to FIG. 7, the sampled three-phase instantaneous current values are summed, and when this is detected at a predetermined value or more in consideration of the watt-hour meter, error tolerance of the MOF, and the like, it is considered as the zero phase component), there is a problem in that the zero phase component occurs in the watt-hour meter as illustrated in FIG. 7 even when the three-phase current is balanced.

Figure 8:
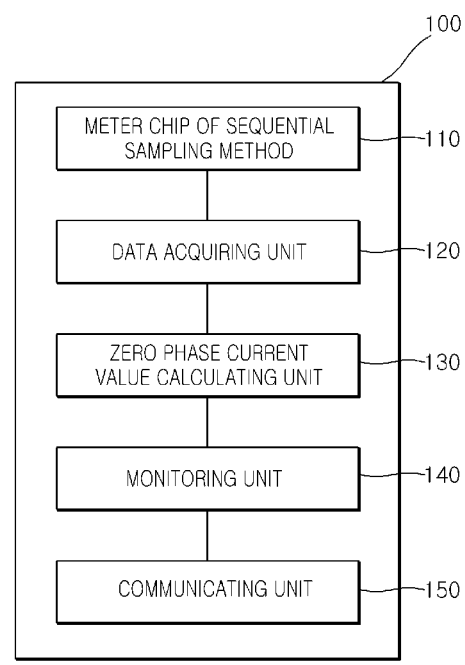
FIG. 8 is a block diagram illustrating a device for detecting a detecting a zero phase component of a watt-hour meter according to an embodiment of the present invention.

Therefore, the present invention tries to address the aforementioned problem using a device for detecting a zero phase component of the watt-hour meter illustrated in FIG. 8.

FIG. 8 is a block diagram illustrating a device for detecting a detecting a zero phase component of a watt-hour meter according to an embodiment of the present invention.

A device 100 for detecting a zero phase component of the watt-hour meter according to the embodiment of the present invention includes a meter chip 110 (hereinafter referred to as a "meter chip") of the sequential sampling method, a data acquiring unit 120, a zero phase current value calculating unit 130, a monitoring unit 140, and a communicating unit 150.

Each component will be described. The meter chip 110 acquires data on current of each phase using the sequential sampling method. The data acquiring unit 120 acquires sequential data on each phase from the meter chip 110.

Meanwhile, the zero phase current value calculating unit 130 sums instantaneous current values for each phase from the sequential data acquired in the data acquiring unit 120 and calculates an instantaneous current value for fault detection.

At this time, the zero phase current value calculating unit may extract a number of the instantaneous current values for fault detection corresponding to a plurality of phases.

This will be described below with reference to FIG. 10.

Then, the zero phase current value calculating unit 130 may sum the extracted instantaneous values for fault detection and calculate the zero phase current value.

Meanwhile, the monitoring unit 140 determines whether the zero phase current value calculated in the zero phase current value calculating unit 130 exceeds a predetermined reference value.

When the calculated zero phase current value exceeds the predetermined reference value, the monitoring unit 140 generates event information corresponding thereto.

Here, the event information may include at least one of a value of the zero phase current exceeding the reference value, a time at which the zero phase current exceeds the reference value, and an ID of a corresponding watt-hour meter.

Meanwhile, the communicating unit 150 may transmit the event information generated from the monitoring unit 140 to a terminal of an administrator (not illustrated) and provide the administrator with notification on whether an abnormality occurs.

Here, the aforementioned event information may be transmitted to the terminal of the administrator (not illustrated) in the form of a short message or multimedia message. The terminal of the administrator (not illustrated) may include at least one of mobile communication terminals including a desktop PC, a laptop PC, a smartphone, a PDA, and the like of the administrator.

Therefore, remote monitoring without an administrator visiting the site to check the abnormality as in the related art is possible, and thereby it is possible to perform systematic and efficient MOF fault management.

For reference, components illustrated in FIG. 8 according to the embodiment of the present invention refer to software or a hardware component such as a field programmable gate array (FPGA) or an application specific integrated circuit (ASIC) and perform predetermined functions.

However, the "components" are not limited to software or hardware. Each component may be configured in a recording medium that can be addressed or may be configured to reproduce at least one processor.

Accordingly, examples of the component include software components, object-oriented software components, class components, components such as task components, processes, functions, properties, procedures, subroutines, segments in program codes, drivers, firmware, microcode, circuits, data, databases, data structures, tables, arrays, and variables.

Components and functions provided in corresponding components may be combined into fewer components or may be further separated into additional components.

Figure 9:
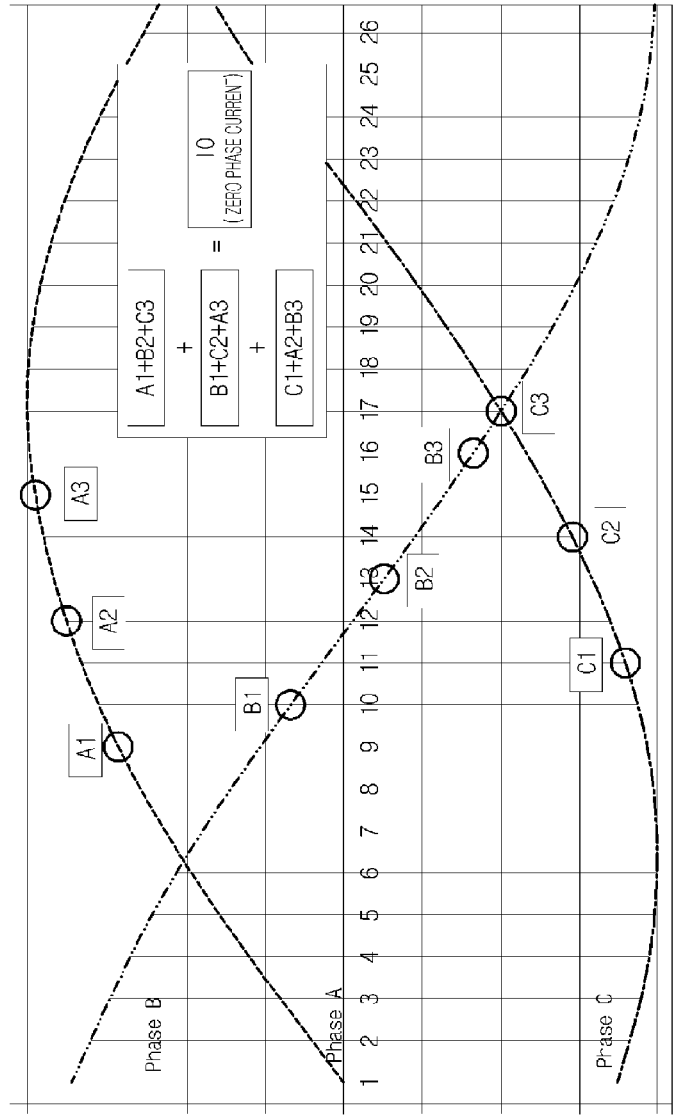
FIG. 9 is a diagram illustrating a method of calculating a zero phase current value by summing instantaneous current values for fault detection in a zero phase current value calculating unit according to an embodiment of the present invention.

FIG. 9 is a diagram illustrating a method of calculating a zero phase current value by summing instantaneous current values for fault detection in the zero phase current value calculating unit 130 according to an embodiment of the present invention.

In three phases (A, B, and C), the zero phase current value calculating unit 130 calculates first, second, and third instantaneous current values for fault detection.

Here, the first instantaneous current value for fault detection is A1+B2+C3, the second instantaneous current value for fault detection is B1+C2+A3, and the third instantaneous current value for fault detection is C1+A2+B3.

Then, the zero phase current value calculating unit 130 may sum the first, second, and third instantaneous current values for fault detection calculated using the aforementioned method and calculate the zero phase current value.

Meanwhile, in general, when leakage current is generated in a device, resistance ohmic contact occurs, and this has no influence on supply voltage or a phase of current.

However, when leakage current due to a fault is generated in the MOF made of an inductance component, a magnetization component is leaked, and thereby a phase and a size of current of a secondary side of the MOF are changed.

In order to identify a phenomenon of zero phase component generation due to the above phenomenon, the following simulation was performed.

First, zero phase component detection of three-phase balanced current having no measurement value error was simulated.

Here, as described above, the three-phase balanced current refers to balanced current flowing into the secondary side of the MOF regardless of load current balance of the secondary side of the transformer according to a characteristic of the Δ transformer, and always maintains a balance condition when the MOF is normal.

Therefore, even when a size and a phase of the three-phase current are different according to the characteristic of the Δ transformer, when the balance condition is satisfied, a computation result is always the same.

Figure 10:
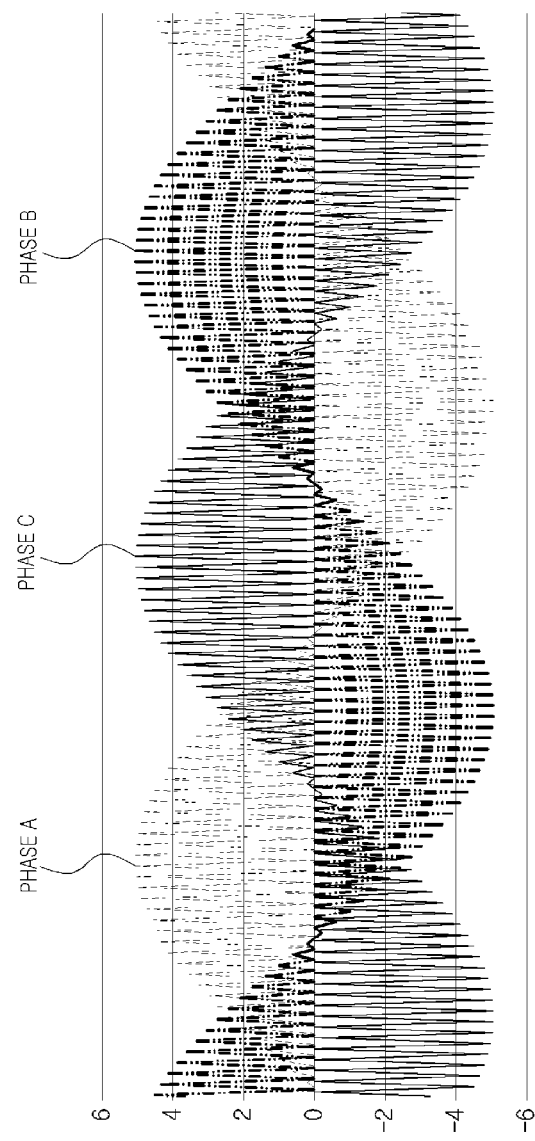
FIG. 10 is a diagram illustrating three-phase balanced current using a general sequential sampling method.

FIG. 10 is a diagram illustrating three-phase balanced current using a general sequential sampling method.

FIG. 10 represents three-phase balanced current of 5 [A], which is a maximum input value of the watt-hour meter that acquires data using the sequential sampling method at 42 [sampling rate].

Figure 11:
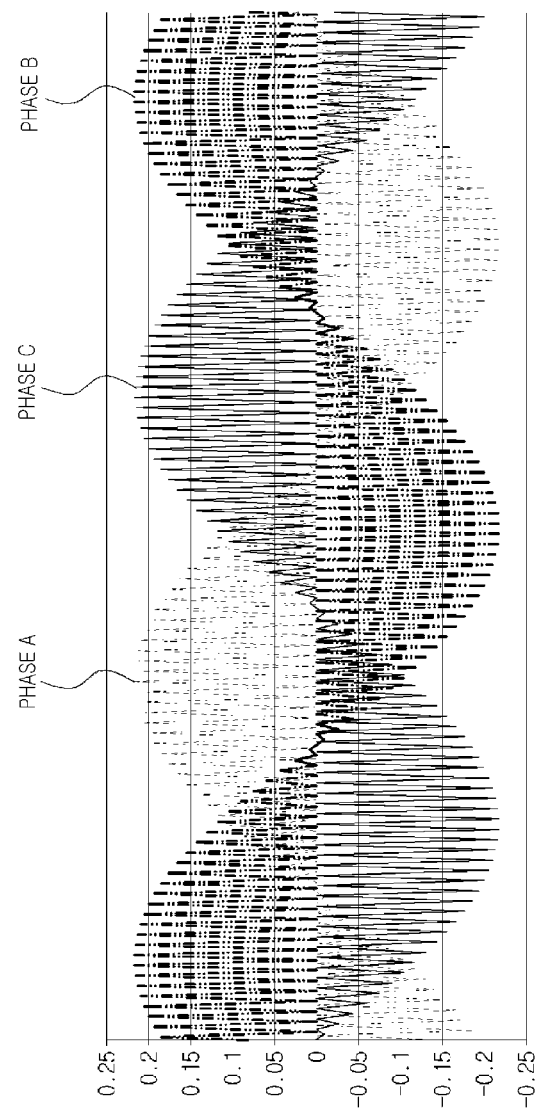
FIG. 11 is a diagram illustrating a composite value of three-phase balanced current using the general sequential sampling method.

FIG. 11 is a diagram illustrating a composite value of three-phase balanced current using the general sequential sampling method.

Figure 12:
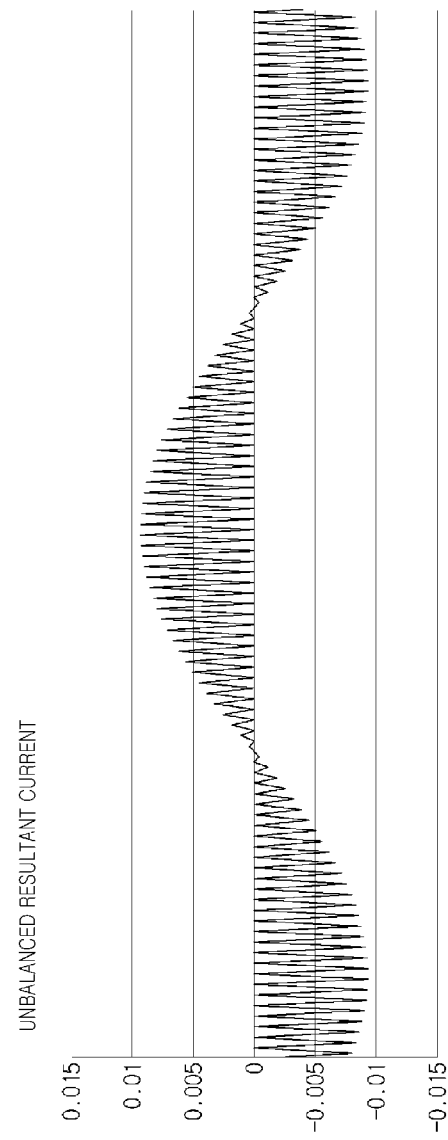
FIG. 12 is a diagram illustrating a result of analyzing a zero phase component using the composite value of three-phase balanced current illustrated in FIG. 11.

FIG. 12 is a diagram illustrating a result of analyzing a zero phase component using the composite value of three-phase balanced current illustrated in FIG. 11.

As shown in a result value in FIG. 12, it is observed that the zero phase component rarely appears normal even in 5 [A], which is a maximum input value of the watt-hour meter (less than 0.01 A).

Figure 13:
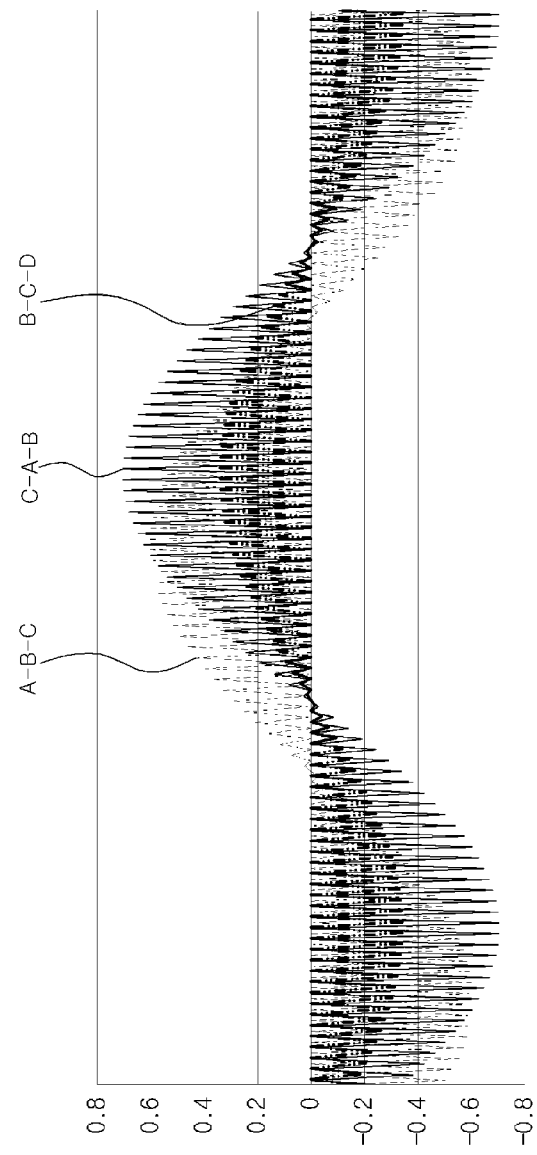
FIG. 13 is a diagram illustrating a composite value of three-phase current values using a device for detecting a zero phase component according to an embodiment of the present invention.

FIG. 13 is a diagram illustrating a composite value of three-phase current values using the device 100 for detecting a zero phase component according to an embodiment of the present invention.

In FIG. 13, in consideration of the MOF and a general degree of precision of the watt-hour meter, simulation was performed by applying a phase error of 5° and a ratio error of a 1.0 level.

Figure 14:
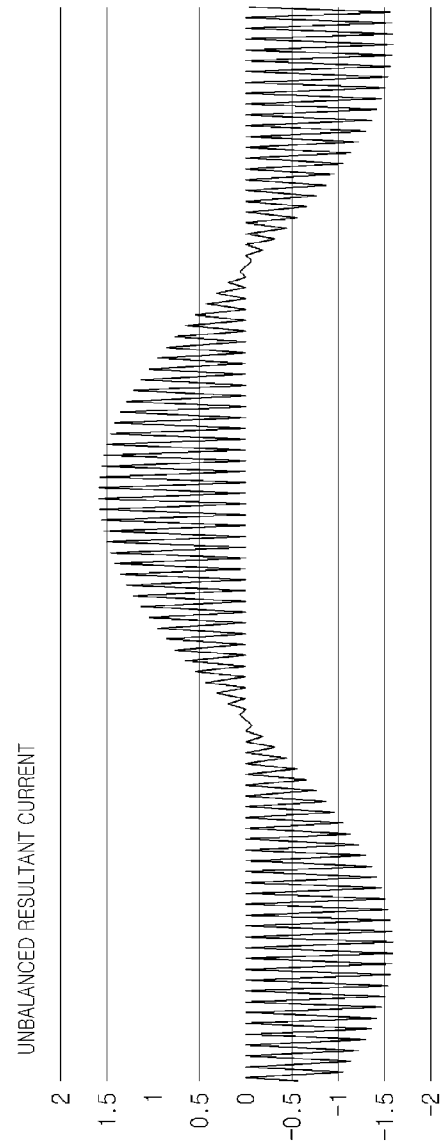
FIG. 14 is a diagram illustrating a detection result of a zero phase component using the composite value of FIG. 13.

FIG. 14 is a diagram illustrating a detection result of a zero phase component using the composite value of FIG. 13.

As illustrated in FIG. 14, it is observed that the zero phase component (maximum 1.6 A) is significantly detected more than in the normal state.

Figure 15:
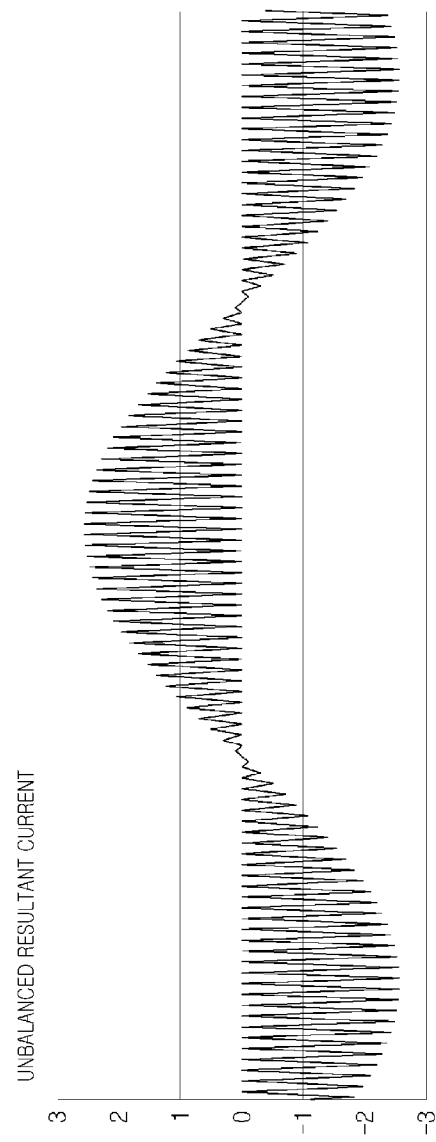
FIG. 15 is a diagram illustrating a detection result of a zero phase component using a device for detecting a zero phase component according to another embodiment of the present invention.

FIG. 15 is a diagram illustrating a detection result of a zero phase component using the device 100 for detecting a zero phase component according to another embodiment of the present invention.

FIG. 15 represents a result of a case in which, due to the MOF fault, a phase and a current value have a phase difference of 8° and a ratio error of 2%. As illustrated in FIG. 15, it is observed that it is detected up to a maximum of 2.1 [A].

Figure 16:
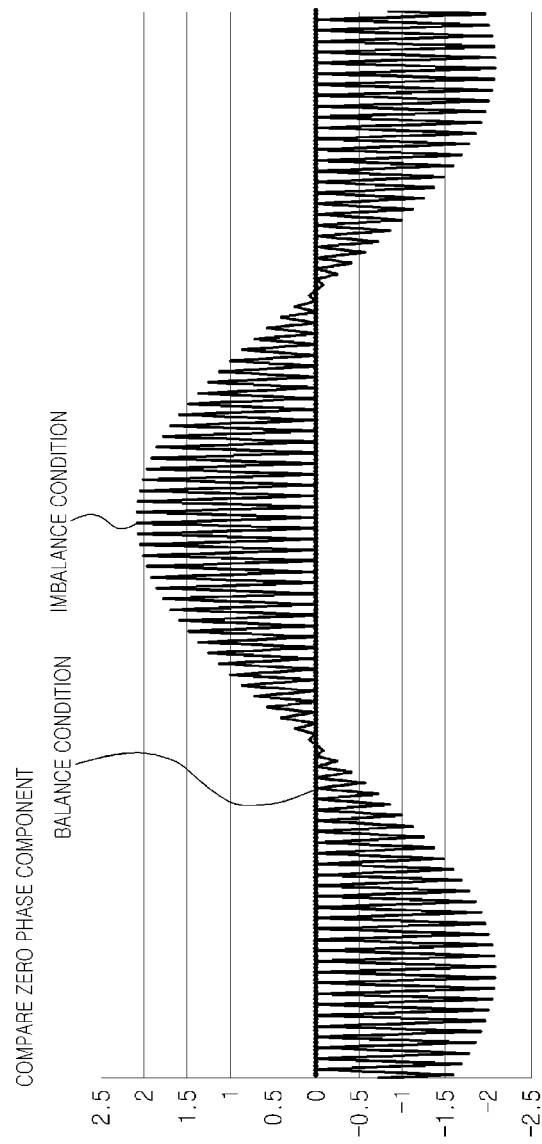
FIG. 16 is a diagram illustrating a comparison result of detecting a zero phase component using the device for detecting a zero phase component of the present invention.

FIG. 16 is a diagram illustrating a comparison result of detecting a zero phase component using the device 100 for detecting a zero phase component of the present invention.

FIG. 16 shows a simulation result that represents comparison of each zero phase component detection value when the three-phase current is in the balance condition and in the imbalance condition due to the MOF fault. It is observed that a size of the zero phase component detection value is significantly different under the two different conditions.

As a result, it is possible to detect the zero phase component even in a method of acquiring sequential sampling data using the aforementioned detecting method.

When the detected zero phase component exceeds the predetermined reference value, it is transmitted to the terminal (not illustrated) of the administrator, and thereby it is possible to determine remotely whether the MOF fault occurs.

Figure 17:
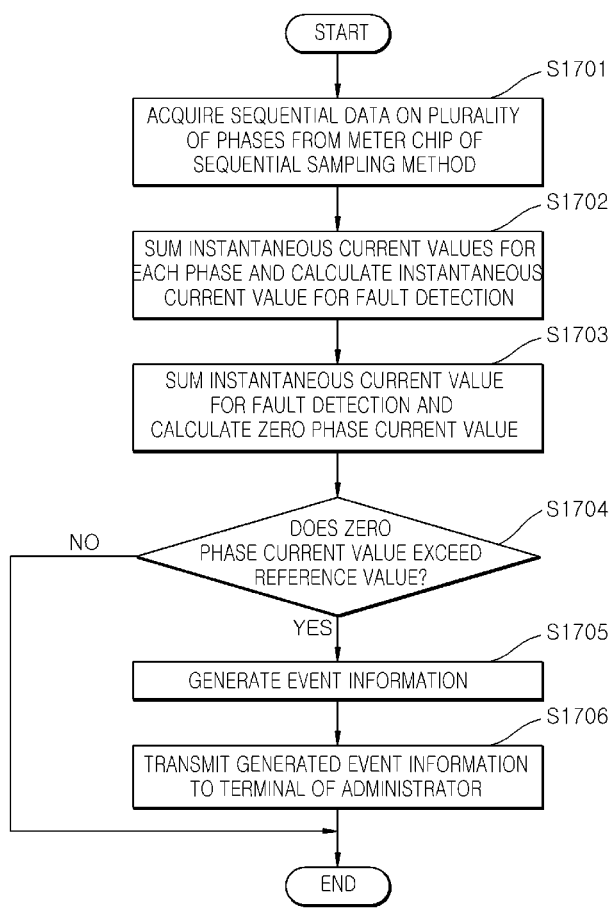
FIG. 17 is a flowchart illustrating a process of detecting a zero phase component in a sequential sampling method using a device for detecting a zero phase component according to an embodiment of the present invention.

FIG. 17 is a flowchart illustrating a process of detecting a zero phase component in a sequential sampling method using the device 100 for detecting a zero phase component according to an embodiment of the present invention.

First, the device 100 for detecting a zero phase component acquires sequential data on a plurality of phases from a meter chip of a sequential sampling method (S1701).

After the operation of S1701, the device 100 for detecting a zero phase component sums instantaneous current values for each phase from the sequential data acquired in the operation of S1701 and calculates an instantaneous current value for fault detection (S1702).

In this case, the device 100 for detecting a zero phase component may extract a number of the instantaneous current values for fault detection corresponding to the plurality of phases.

After the operation of S1702, the device 100 for detecting a zero phase component calculates a zero phase current value based on the instantaneous current value for fault detection calculated in the operation of S1702 (S1703).

In this case, the device 100 for detecting a zero phase component may calculate the zero phase current value by summing instantaneous current values for fault detection.

After the operation of S1703, the device 100 for detecting a zero phase component determines whether the zero phase current value calculated in the operation of S1703 exceeds a predetermined reference value (S1704), and when it exceeds the reference value, generates event information corresponding thereto (S1705).

After the operation of S1705, the device 100 for detecting a zero phase component transmits the event information generated in the operation of S1704 to the terminal of the administrator (S1706).

While the present invention has been particularly described with reference to exemplary embodiments, it will be understood by those of skilled in the art that various changes and modifications may be made without departing from the spirit and scope of the present invention.

Therefore, the exemplary embodiments disclosed in the present invention should be considered in a descriptive sense only and not for purposes of limitation. The scope of the invention is not limited to these embodiments.

It should be understood that the scope of the invention is defined by the appended claims and encompasses all equivalents that fall within the scope of the appended claims.

The invention claimed is:

1. A device for detecting a zero phase component, comprising:
   a meter chip of a sequential sampling method;
   a data acquiring unit configured to acquire a plurality of sequential data values of each of a plurality of phases from the meter chip;
   a zero phase current value calculating unit configured to calculate a zero phase current value based on the acquired plurality of sequential data values of each of a plurality of phases; and
   a monitoring unit configured to determine whether the calculated zero phase current value exceeds a predetermined reference value and then to generate event information corresponding thereto when the calculated zero phase current value exceeds the reference value,
   wherein the zero phase current value calculating unit:
   extracts a number of instantaneous current values for fault detection corresponding to a number of the phases from the acquired plurality of sequential data values of each of a plurality of phases,
   calculates first, second, and third instantaneous current values for fault detection when the plurality of phases are three phases, and
   calculates:
     the first instantaneous current value for fault detection by summing a first instantaneous current value of a first phase of the three phases a second instantaneous current value of a second phase of the three phases and a third instantaneous current value of a third phase of the three phases,
     the second instantaneous current value for fault detection by summing a first instantaneous current value of the second phase a second instantaneous current value of the third phase and a third instantaneous current value of the first phase, and
     the third instantaneous current value for fault detection by summing a first instantaneous current value of the third phase a second instantaneous current value of the first phase and a third instantaneous current value of the second phase.

2. The device of claim 1, further comprising
   a communicating unit configured to transmit the generated event information to a terminal of an administrator.

3. The device of claim 1,
   wherein the zero phase current value calculating unit calculates the zero phase current value by summing the first, second, and third instantaneous current values for fault detection.

4. A method of detecting a zero phase component in a sequential sampling method, the method comprising:
   (a) acquiring a plurality of sequential data values of each of a plurality of phases from a meter chip of a sequential sampling method;
   (b) calculating a zero phase current value for fault detection based on the plurality of acquired sequential data values of each of a plurality of phases;
   (c) determining whether the calculated zero phase current value exceeds a predetermined reference value, and then when it exceeds the reference value, generating event information corresponding thereto,
   wherein the calculating includes extracting a number of instantaneous current values for fault detection corresponding to a number of the phases from the acquired plurality of sequential data values of each of a plurality of phases, and
   wherein the calculating includes calculating first, second, and third instantaneous current values for fault detection when the plurality of phases are three phases, including the steps of:
   calculating the first instantaneous current value for fault detection by summing a first instantaneous current value of a first phase of the three phases a second instantaneous current value of a second phase of the three phases and a third instantaneous current value of a third phase of the three phases,
   calculating the second instantaneous current value for fault detection by summing a first instantaneous current value of the second phase a second instantaneous current value of the third phase and a third instantaneous current value of the first phase, and
   calculating the third instantaneous current value for fault detection by summing a first instantaneous current value of the third phase a second instantaneous current value of the first phase and a third instantaneous current value of the second phase.

5. The method of claim 4, further comprising
   (d) transmitting the event information generated in the operation of (c) to a terminal of an administrator.

6. The method of claim 4,
   wherein, in the operation of (b), a number of the instantaneous current values for fault detection corresponding to the plurality of phases is extracted from the acquired plurality of sequential data values of each of a plurality of phases.

7. The method of claim 6,
   wherein, in the operation of (b), the zero phase current value is calculated by summing the instantaneous current values for fault detection of the extracted number.

8. The device of claim 1, wherein the event information includes at least one of the zero phase current value which exceeds the reference value, a time at which the zero phase current exceeds the reference value, and an ID of a corresponding watt-hour meter.

\* \* \* \* \*